United States Patent [19]

Tanaka et al.

[11] 3,947,629

[45] Mar. 30, 1976

[54] TELEVISION RECEIVER I. F. CIRCUITRY

[75] Inventors: Toshihide Tanaka, Osaka; Seiji Fujisawa, Ikoma; Susumu Ide, Katano, all of Japan

[73] Assignee: Matsushita Electric Industrial Company, Ltd., Osaka, Japan

[22] Filed: June 4, 1975

[21] Appl. No.: 583,855

Related U.S. Application Data

[63] Continuation of Ser. No. 373,414, June 25, 1973, abandoned.

[30] Foreign Application Priority Data

June 30, 1972 Japan................................ 47-66121

[52] U.S. Cl............... 178/7.3 R; 325/379; 325/381; 325/383; 325/386; 325/488
[51] Int. Cl.².................... H04N 5/44; H04B 1/16
[58] Field of Search......... 178/5.8 R, 5.8 A, 5.8 AF, 178/7.3 R, 7.9; 325/352, 353, 355, 356, 357, 376, 379, 381, 382, 383, 384, 385, 386, 387, 388, 479, 488, 489; 339/17 M; 358/21

[56] References Cited
UNITED STATES PATENTS

| | | | |
|---|---|---|---|
| 2,356,308 | 8/1944 | Fredendall...................... | 178/7.3 R |
| 3,217,096 | 11/1965 | Caprio et al..................... | 178/5.8 R |
| 3,381,236 | 4/1968 | Davis................................. | 330/53 |
| 3,387,214 | 6/1968 | Meyer................................ | 325/355 |
| 3,584,141 | 6/1971 | Kobe et al....................... | 178/5.8 A |
| 3,624,515 | 11/1971 | Rezek et al...................... | 325/357 |
| 3,723,884 | 3/1973 | Asplin............................... | 325/355 |

*Primary Examiner*—Robert L. Griffin
*Assistant Examiner*—George G. Stellar
*Attorney, Agent, or Firm*—Stevens, Davis, Miller & Mosher

[57] ABSTRACT

A television receiver comprising a first printed circuit board having a helical resonator filter, an adjacent channel trap circuit and an impedance converter circuit for providing a reduced output impedance, the first printed circuit board being secured to the tuner casing, and a second printed circuit board having first and subsequent i-f amplifier stages, the two printed circuit boards being connected to each other, whereby good skirt characteristics can be simply obtained. Also, no overall adjustment is required but the tuner and i-f amplifier may be adjusted separately, thus providing improved serviceability.

1 Claim, 5 Drawing Figures

TELEVISION RECEIVER I. F. CIRCUITRY

This is a continuation of application Ser. No. 373,414, filed June 25, 1973, now abandoned.

This invention relates to television receivers and, more particularly, a television receiver having an improved picture i-f amplifier.

FIG. 1 is a circuit diagram showing part of a prior art television receiver.

FIG. 2 a circuit diagram showing another example of the trap circuit used in the above circuit.

In the picture i-f amplifier circuit of the television receiver, the frequency selectivity is usually very important, and the recent trend for the frequency selectivity is to require better skirt characteristics.

The first requirement concerns CATV (community antenna television). In CATV, a signal is transmitted through a co-axial cable line, so that the signal is subject to attenuation due to loss during transmission. Therefore, relays are inserted in the transmission line for amplifying the attenuated signal so as to maintain a constant signal level. As a reference signal for maintaining the constant signal level the pilot signal is inserted outside the channel band. However, since the pilot signal level is considerably high, the inserted pilot signal cannot be trapped with the usual skirt characteristics, thus adversely affecting the reproduced picture. Therefore, it is necessary to extremely improve the skirt characteristics.

By way of example, in a certain region in the United States of America 73.5 MHz is used as a pilot signal. This frequency is spaced only by 3.75 MHz upwardly from the carrier frequency of channel No. 5 in the U.S.A., and the amplitude of this pilot signal is very high, being about 10 dB lower than the amplitude at the carrier frequency.

Secondly, it is necessary to provide some measure against the effect of FM broadcasting. In regions where the magnitude of the FM signal wave is very large, the FM signal frequency adversely affects the picture signal similar to the afore-mentioned pilot signal. To cope with this, it is necessary to sufficiently attenuate the FM signal frequency band with improved skirt characteristics similar to the afore-mentioned measure against the pilot signal in the CATV.

Meanwhile, it is the recent trend in television receivers to use plug-in type printed circuit boards for improved serviceability. This type of television receiver is assembled by inserting separate printed circuit boards individually having a picture i-f amplifier stage, video detector stage, video amplifier stage, sound detector stage, audio amplifier stage, etc. into a connector provided in the cabinet.

Figure 1:
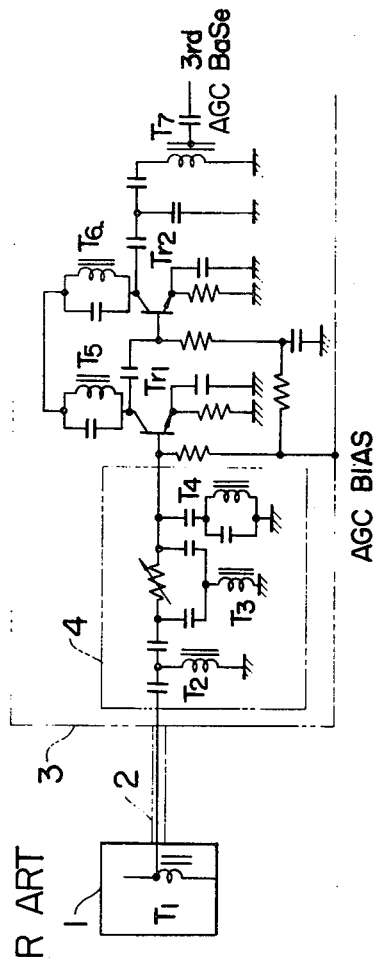
Figure 2:
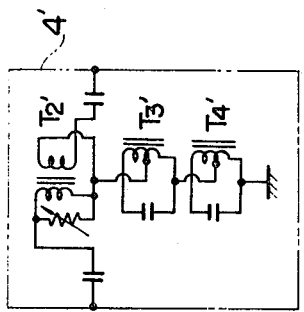

The prior art picture i-f amplifier circuit in such a television receiver will now be described. As shown in FIG. 1, an output transformer $T_1$ of the tuner is connected through a shielding wire 2 to an input transformer $T_2$ of the i-f amplifier for double tuning. The output of the input transformer is coupled through a self channel sound trap $T_3$ and an adjacent channel sound trap $T_4$ to a transformer $T_5$ of a first amplifier $Tr_1$ for single tuning. The output of this stage is coupled through transformers $T_6$ and $T_7$ of a second amplifier $Tr_2$ for double tuning before being added to a third amplifier. The circuit generally indicated at 4 is a T-type bridge trap circuit. FIG. 2 shows the case of using a bifilter trap circuit 4'. In FIG. 2, $T_2'$ is a coil for double tuning, and $T_3'$ and $T_4'$ are a self channel sound trap coil and an adjacent channel sound trap coil each. It will be seen that in the prior art double tuning is taken by the converter transformer $T_1$ of the tuner 1 and the input coil $T_2$ of the i-f amplifier circuit 3 assembled on a priinted circuit board, so that it is impossible to individually adjust the tuner 1 and circuit 3, that is, overall adjustment is always required between tuner 1 and circuit 3. If the overall adjustment is insufficient, the skirt characteristic is deteriorated, giving rise to the afore-mentioned drawbacks. Also, in a plug-in type television receiver, which features improved serviceability in that a printed circuit board can be replaced in case of trouble in a circuit contained therein, very troublesome overall adjustment is required at the time of replacement of the printed circuit board tuner 1.

The invention will now be described in connection with the accompanying drawing.

Figure 3:
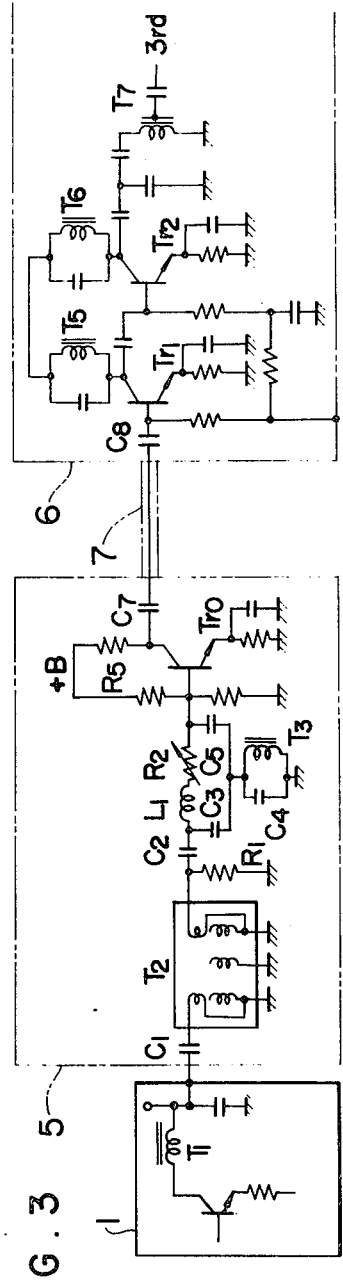
FIG. 3 is a circuit diagram showing part of a television receiver according to the invention.

FIG. 3 shows an embodiment of the invention. It has separate circuits 5 and 6. The circuit 5 corresponds to the input side trap circuit 4 in the circuit 3 shown in FIG. 1. In this embodiment, the circuit 5 is provided on an independent printed circuit board secured to the casing of the tuner 1, so that it can be adjusted on the side of the tuner.

Figure 5:
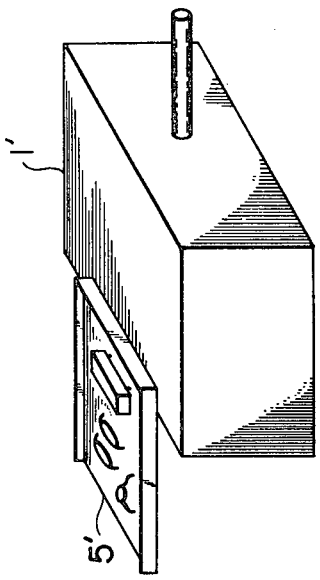
FIG. 5 is a perspective view showing a tuner and a printed circuit board attached thereto.

FIG. 5 shows the casing 1' of the tuner and the printed circuit board 5' secured thereto and carrying the circuit 5.

Referring again to FIG. 3, $C_1$, $C_2$ and $C_7$ designate coupling capacitors, $T_2$ a helical resonator filter, $R_1$ a damping resistor, and $C_3$, $C_4$, $C_5$, $L_1$, $T_3$ and $R_2$ elements constituting a T-type bridge trap circuit for trapping the adjacent channel sound. A transistor $Tr_0$ forms a collector follower using a collector resistor $R_5$ of very low impedance (of the order of 100 ohms). It serves as an impedance converter to provide low output impedance for suppressing variations of the waveform and gain due to load. The output of the transistor $Tr_0$ is coupled through the coupling capacitor $C_7$ and a shielding wire 7 to the circuit 6 formed in a separate printed circuit board 6. More particularly, the output of the circuit 5 is coupled through a coupling capacitor $C_8$ to the base of a transistor $Tr_1$ constituting the first amplifier. The shielding wire 7 has a predetermined capacitance per unit wire length, so that the selectivity characteristics are greatly affected by fluctuations of the wire length. In order to reduce this effect of the fluctuations of the wire length, it is necessary to make the output impedance of the circuit 5 sufficiently low. Accordingly, the collector follower of the transistor $Tr_0$ is inserted.

Figure 4:
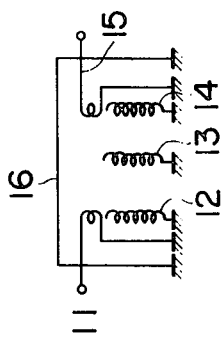
FIG. 4 shows the construction of a helical resonator filter.

FIG. 4 shows the construction of the helical resonator filter $T_2$. It comprises an input coupling coil 11, single layer solenoids 12, 13, and 14, an output coupling coil 15 and a shield casing 16. This filter $T_2$ is presented in an article entitled "Realization of a Filter with Helical Components" in "IRE TRANSACTION ON COMPONENT PARTS". Its bandwidth is provided through triple tuning by the single layer solenoids 12, 13 and 14, and its Q is high. Accordingly, by connecting the helical resonator filter $T_2$ and the tuner 1 through the coupling capacitor $C_1$ the skirt characteristic may be improved.

As has been described in the foregoing, according to the invention it is possible to construct a television receiver with a plug-in type printed circuit board, which ensures freedom from overall adjustment and richness of serviceability without sacrifice in the selectivity characteristics.

More particularly, according to the invention the helical resonator filter, adjacent channel sound trap and impedance converter are provided on the same printed circuit board secured to the tuner casing, and the output of this printed circuit board is coupled to the first i-f amplifier stage provided on a separate printed circuit board, so that the tuner and helical resonator filter printed board circuit may be adjusted as an integral element.

In other words, the selectivity is determined by the adjustment of the tuner and the printed circuit board provided on its casing, while the picture i-f amplifier stage may be adjusted independently. Thus, the overall adjustment is not necessary. This means that re-adjustment is not required at the time of replacement of the tuner and the i-f amplifier printed circuit board, so that it is possible to obtain improved serviceability and facilitate the adjusting operation in the manufacturing process in mass production.

Further, since the selectivity of the helical resonator filter is very superior, the intermediate frequency selectivity characteristics determined by the adjustment of the tuner and printed circuit board integral therewith are improved to provide better cross modulation characteristics, and also they are not affected by radio interference. Furthermore, since the impedance converter circuit is inserted, it is possible to suppress variations of the selectivity waveform due to variations of the shielding wire length.

What is claimed is:

1. The claim: A television receiver set including a tuner casing having a tuner circuit, and a circuit means for determining an overall frequency selectivity characteristic of a video IF signal, said circuit means comprising:

a. a first IF circuit comprising a first printed circuit board secured to said casing and including a filter circuit having a helical filter and an adjacent channel trap having an output and connected to said helical filter through a capacitor for determining a portion of said overall frequency selectivity characteristic and providing the video IF signal, and b. a second IF circuit being adjusted for determining the portion of said overall frequency selectivity characteristic and comprising a second printed circuit board separated from but electrically connected through a shielded wire to said first IF circuit and including means for amplifying the video IF signal, said second IF circuit and said shielded wire being adjusted with respect to the portion of the overall frequency characteristic determined by said first IF circuit, wherein said first IF circuit further includes an impedance conversion circuit connected between said channel trap and said shielded wire and having a low impedance for suppressing the influence of deviations possibly caused in the adjustment of the shielded wire and the second IF circuit to the first IF circuit, said conversion circuit comprising a transistor, a first resistor of a low impedance pure resistance connected as a collector output load of said transistor to said shielded wire, a second resistor connected to the emitter of said transistor, and a base bias circuit connected to the base of said transistor for applying a fixed DC bias voltage thereto, and wherein said base is AC coupled to the output of said channel trap, whereby said first and second IF circuits can be substantially independently adjusted to obtain the overall frequency selectivity characteristic and mutual adjustment therefor of both circuits can be dispensed with.

* * * * *